US011218149B2

(12) United States Patent
Gao

(10) Patent No.: US 11,218,149 B2
(45) Date of Patent: Jan. 4, 2022

(54) MULTIPLEXER DEVICE AND SIGNAL SWITCHING METHOD

(71) Applicant: Realtek Semiconductor Corporation, Hsinchu (TW)

(72) Inventor: Zhi-Xian Gao, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/034,375

(22) Filed: Sep. 28, 2020

(65) Prior Publication Data

US 2021/0111718 A1 Apr. 15, 2021

(30) Foreign Application Priority Data

Oct. 15, 2019 (CN) .......................... 201910978418.2

(51) Int. Cl.
*H03K 17/693* (2006.01)
*H03K 17/687* (2006.01)
*H04L 12/947* (2013.01)
*H03K 17/00* (2006.01)

(52) U.S. Cl.
CPC ....... *H03K 17/6874* (2013.01); *H03K 17/005* (2013.01); *H03K 17/693* (2013.01); *H04L 49/25* (2013.01)

(58) Field of Classification Search
CPC ............. H03K 17/6874; H03K 17/693; H03K 17/005; H03K 17/687; H03K 17/041; H03K 17/04106; H04L 49/25
See application file for complete search history.

(56) References Cited

U.S. PATENT DOCUMENTS 7,157,958 B2 1/2007 Fagan et al.
7,471,132 B2 12/2008 Fagan et al.
2019/0383875 A1* 12/2019 Kim ................... H03K 3/35625

FOREIGN PATENT DOCUMENTS

TW 200527816 A 8/2005

* cited by examiner

*Primary Examiner* — Jung Kim
(74) *Attorney, Agent, or Firm* — Locke Lord LLP; Tim Tingkang Xia, Esq.

(57) ABSTRACT

A multiplexer device includes a plurality of selection circuits and potential setting circuits. The plurality of selection circuits respectively receive a first data signal and a second data signal, and select a corresponding one of the first data signal and the second data signal as an output signal according to the first selection signal. When the second data signal is selected as the output signal, the potential setting circuit sets a potential of a node of a first selection circuit of the plurality of selection circuits to a first voltage. The first selection circuit is configured to receive a first data signal.

13 Claims, 6 Drawing Sheets

600

| The corresponding one of the data signal A and the data signal B is selected as the output signal SO according to the selection signal SEL. | ~S610 |

| When the data signal B is selected as the output signal SI, the potential of the node NA1 (or the node NA2) of the selection circuit 120 is set to the voltage VDD (or the voltage GND), and the selection circuit 120 receives the data signal A. | ~S620 |

FIG. 6

MULTIPLEXER DEVICE AND SIGNAL SWITCHING METHOD

CROSS-REFERENCE TO RELATED APPLICATION

This application claims priority to China Application Serial Number 201910978418.2, filed Oct. 15, 2019, which is herein incorporated by reference in its entirety.

BACKGROUND

Technical Field

The present application relates to a multiplexer device and a signal switching method, and especially relates to a multiplexer device and a signal switching method applied to high speed data transmission.

Description of Related Art

Multiplexers can be used in high-speed data transmission applications to provide signal switching operations. However, in the existing multiplexer, due to the parasitic capacitance existing in the circuit, the multiplexer may be affected by jitter or inter-symbol interference, etc., causing attenuation or distortion on the output signal.

SUMMARY

In order to solve the above problems, aspects of the present application are to provide a multiplexer device including a plurality of selection circuits and a potential setting circuit. The plurality of selection circuits respectively receive a first data signal and a second data signal, and select a corresponding one of the first data signal and the second data signal as an output signal according to the first selection signal. When the second data signal is selected as the output signal, the potential setting circuit sets a potential of a node of a first selection circuit of the plurality of selection circuits to a first voltage. The first selection circuit is configured to receive a first data signal.

Aspects of the present application provide a signal switching method including the following operations: selecting a corresponding one of a first data signal and a second data signal as an output signal according to a first selection signal; and setting a potential of a first node of a first selection circuit to a first voltage when the second data signal is selected as the output signal, in which the first selection circuit is configured to receive the first data signal.

In sum, the multiplexer device and the signal switching method provided by embodiments of the present application can retain the potential of the internal node of the circuit during the signal switching process to prevent the output of the multiplexer from being disturbed by jitter and/or parasitic capacitance.

It is to be understood that both the foregoing general description and the following detailed description are by examples, and are intended to provide further explanation of the invention as claimed.

BRIEF DESCRIPTION OF THE DRAWINGS

FIG. 6 is a flowchart of a signal switching method according to embodiments of the present application.

DETAILED DESCRIPTION

Figure 1A:
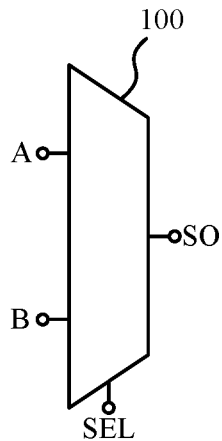
FIG. 1A is a schematic diagram of a multiplexer device according to embodiments of the present application.

The embodiments are described in detail below with reference to the appended drawings to better understand the aspects of the present application. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms "coupled" or "connected" as used herein may mean that two or more elements are directly in physical or electrical contact, or are indirectly in physical or electrical contact with each other. It can also mean that two or more elements interact with each other.

As used herein, the term "circuitry" can generally refer to a single system that includes one or more circuits. The term "circuit" can generally refer to an object that is connected in a certain manner by one or more transistors and/or one or more active and passive components to process a signal.

For ease of understanding, similar elements in the various figures will be designated by the same reference numerals.

FIG. 1A is a schematic diagram of a multiplexer device 100 according to embodiments of the present application. The multiplexer device 100 can be applied to a high-speed data transmission circuit to switch a signal path. In various applications, the aforementioned high-speed data transmission may be standards such as USB 3.2, DisplayPort 2.0, HDMI 2.1 or later updated industrial standards, and the present application is not limited thereto.

The multiplexer device 100 may receive two or more data signals and output one of the received data signals as a final output. For example, as shown in FIG. 1A, the multiplexer device 100 is configured to receive a data signal A and a data signal B, and output the data signal A or the data signal B as an output signal SO according to a selection signal SEL.

Figure 1B:
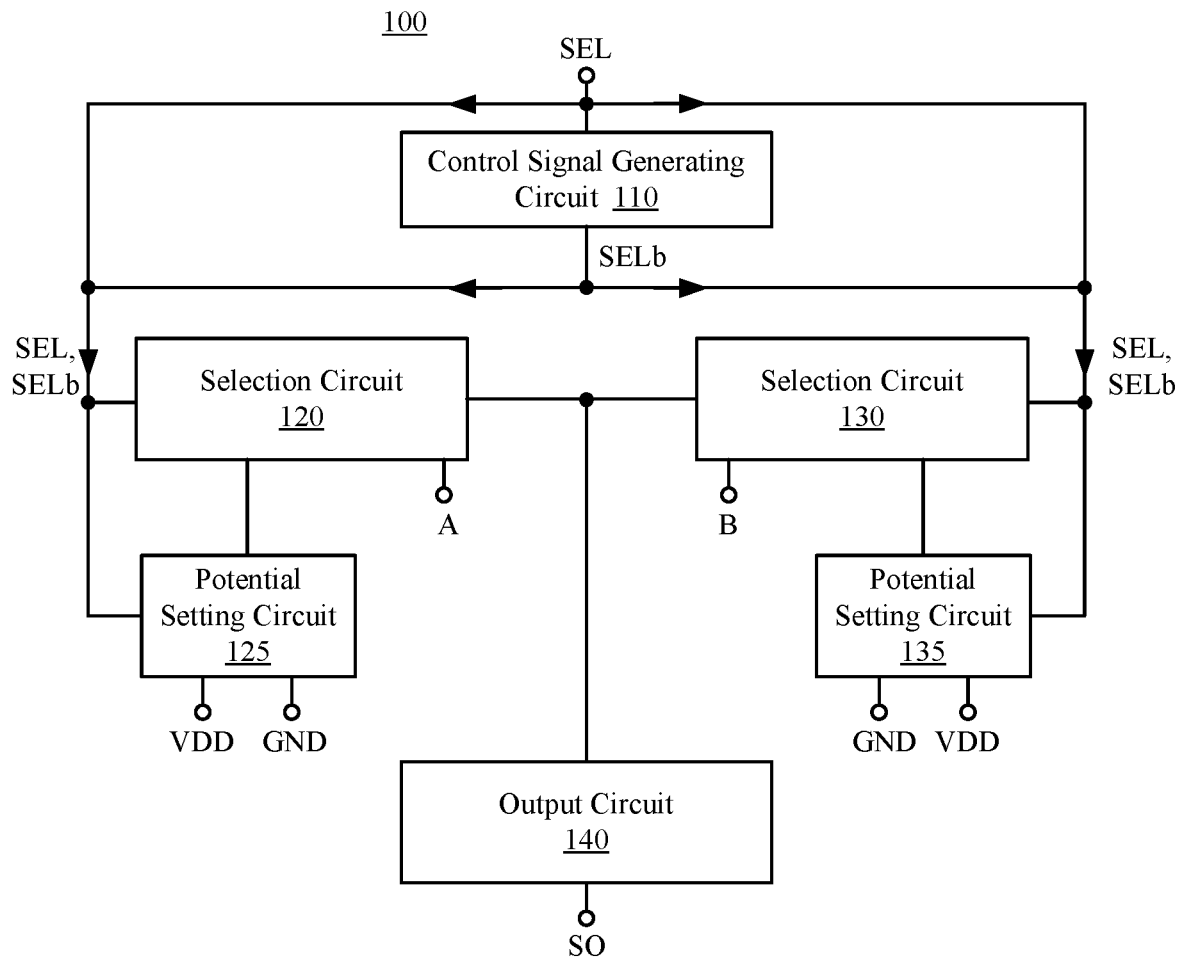
FIG. 1B is a schematic diagram of a multiplexer device according to embodiments of the present application.

FIG. 1B is a schematic diagram of a multiplexer device 100 according to embodiments of the present application.

In some embodiments, the multiplexer device 100 includes a control signal generating circuit 110, a selection circuit 120, a selection circuit 130, a potential setting circuit 125, and a potential setting circuit 135. The control signal generating circuit 110 is configured to generate a control signal required by the multiplexer device 100 according to the selection signal SEL, and may be, for example, a selection signal SELb.

The selection circuit 120 is configured to receive the data signal A and determine whether to output the data signal A as the output signal SO according to the selection signal SEL. The selection circuit 130 is configured to receive the data signal B and decide whether to output the data signal B as the output signal SO according to the selection signal SEL.

The potential setting circuit 125 is provided corresponding to the selection circuit 120, and the potential setting circuit 135 is provided corresponding to the selection circuit 130. In some embodiments, when the data signal B is selected as the output signal SO, the potential setting circuit 125 is used to set the potential of at least one internal node (for example, node NA1 or NA2 in FIG. 2) in the selection circuit 120 to at least one preset voltage. In some embodiments, when the data signal A is selected as the output signal SO, the potential setting circuit 135 is used to set the potential of at least one internal node (for example, node NB1 or NB2 in FIG. 2) in the selection circuit 130 to at least one preset voltage.

In some embodiments, the at least one preset voltage may be a voltage VDD and/or a voltage GND, but the present application is not limited thereto. In some embodiments, the voltage VDD is a system supply voltage, and the voltage GND is a ground voltage. In some embodiments, the voltage VDD is higher than the voltage GND.

In some related technologies, the output signal of the multiplexer may be directly affected by the data signal due to the parasitic capacitance and other components of the internal nodes of the multiplexer. For example, when the frequency of the data signal is high, due to the influence of parasitic capacitance coupling, a corresponding jitter is generated on the output signal of the multiplexer. Alternatively, the parasitic capacitance stores a certain amount of charge in response to a previously received data signal (referred to as the "memory effect"), and has inter-symbol interference (ISI) to the current output of the multiplexer.

Compared with the above related technologies, in some embodiments, by arranging the potential setting circuits 125 and 135, the multiplexer device 100 can reset the potential of its internal node before determining the output signal SO each time to reduce the influence of parasitic capacitance.

In some embodiments, the multiplexer device 100 may further include an output circuit 140. The output circuit 140 may be implemented by an inverter or a buffer circuit, and outputs the signal provided by the selection circuit 120 or the selection circuit 130 as the output signal SO. In some embodiments, the multiplexer device 100 may directly output the signal provided by the selection circuit 120 or the selection circuit 130 as the output signal SO without the output circuit 140.

Figure 2:
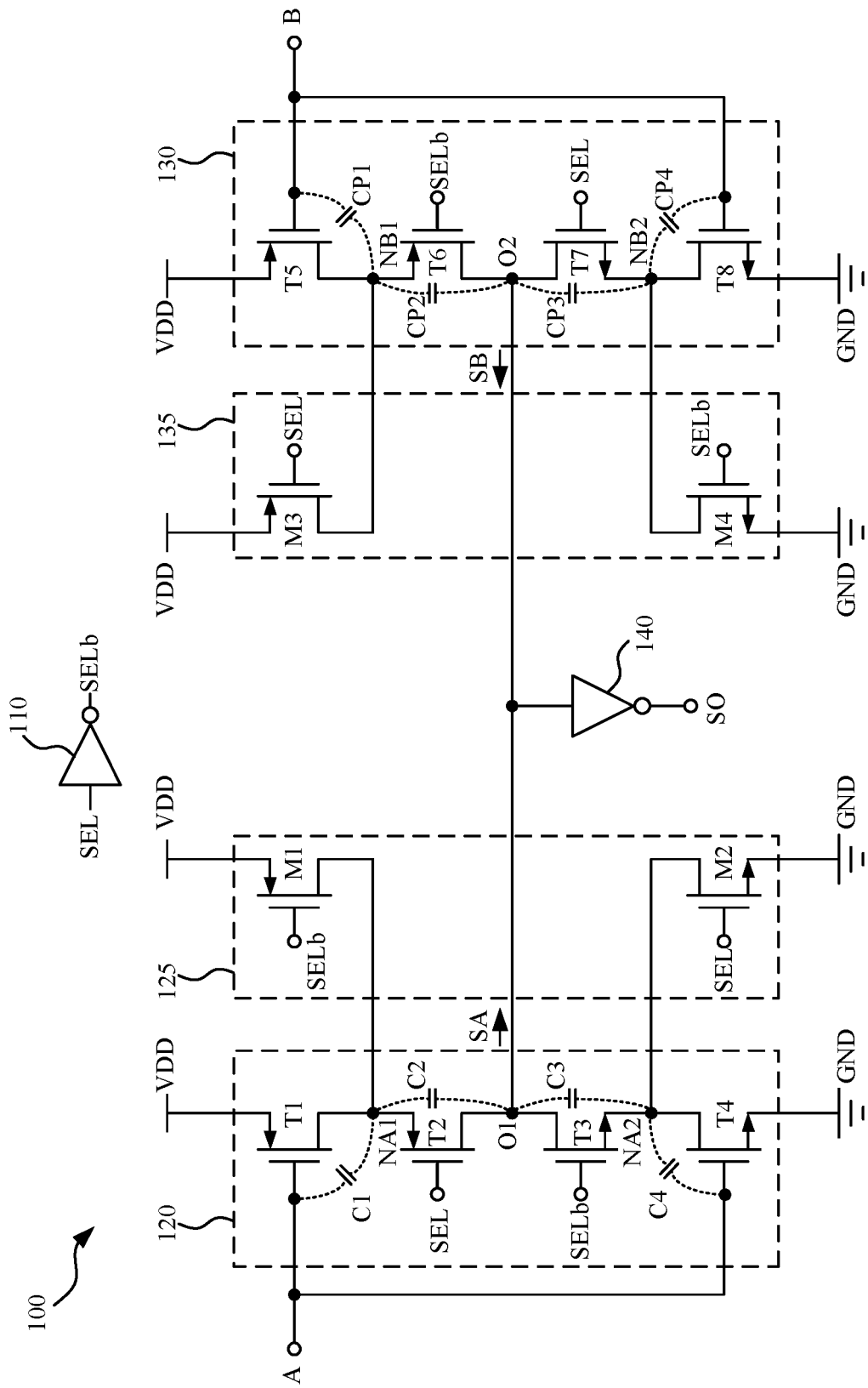
FIG. 2 is a schematic diagram of a multiplexer device of FIG. 1B according to embodiments of the present application.

FIG. 2 is a schematic diagram of a multiplexer device 100 of FIG. 1B according to embodiments of the present application.

In this example, the control signal generating circuit 110 includes an inverter, which generates a selection signal SELb according to the selection signal SEL. The selection circuit 120 includes a plurality of switches T1 to T4. A first terminal of the switch T1 receives the voltage VDD, a second terminal of the switch T1 is coupled to the node NA1, and a control terminal of the switch T1 receives a data signal A. A first terminal of the switch T2 is coupled to the node NA1, a second terminal of the switch T2 (for example, the output node O1) is coupled to a first terminal of the switch T3 and the output circuit 140, and a control terminal of the switch T2 receives the selection signal SEL. A second terminal of the switch T3 is coupled to the node NA2, and a control terminal of the switch T3 receives the selection signal SELb. A first terminal of the switch T4 is coupled to the node NA2, a second terminal of the switch T4 receives a voltage GND, and a control terminal of the switch T4 receives the data signal A.

The selection circuit 130 includes a plurality of switches T5 to T8. The first terminal of the switch T5 receives the voltage VDD, the second terminal of the switch T5 is coupled to the node NB1, and the control terminal of the switch T5 receives the data signal B. The first terminal of the switch T6 is coupled to the node NB1, the second terminal of the switch T6 (for example, the output node O2) is coupled to the first terminal of the switch T7 and the output circuit 140, and the control terminal of the switch T6 receives the selection signal SELb. The second terminal of the switch T7 is coupled to the node NB2, and the control terminal of the switch T7 receives the selection signal SEL. The first terminal of the switch T8 is coupled to the node NB2, the second terminal of the switch T8 receives the voltage GND, and the control terminal of the switch T8 receives the data signal B.

The potential setting circuit 125 includes a plurality of switches M1 to M2. A first terminal of the switch M1 receives the voltage VDD, a second terminal of the switch M1 is coupled to the node NA1, and a control terminal of the switch M1 receives a selection signal SELb. A first terminal of the switch M2 is coupled to the node NA2, a second terminal of the switch M2 receives a voltage GND, and a control terminal of the switch M2 receives a selection signal SEL.

The potential setting circuit 135 includes a plurality of switches M3 to M4. A first terminal of the switch M3 receives the voltage VDD, a second terminal of the switch M3 is coupled to the node NB1, and a control terminal of the switch M3 receives a selection signal SEL. The first terminal of the switch M4 is coupled to the node NB2, the second terminal of the switch M4 receives the voltage GND, and the control terminal of the switch M4 receives the selection signal SELb.

Under the first condition, the selection signal SEL is a logic value 0, and the selection signal SELb is a logic value 1. In response to this first condition, the switches T2 and T3 are turned on, and the switches T6 and T7 are turned off. In other words, the selection circuit 120 is turned on (i.e., the data signal A is selected) to operate as an inverter, and the selection circuit 130 is turned off. In response to the data signal A having a logic value 1, the switch T1 is turned off, and the switch T4 is turned on to pull down the potential of the output node O1 to the voltage GND. In this way, the selection circuit 120 outputs a signal SA having a logic value 0 to the output circuit 140. The output circuit 140 may output an output signal SO having a logic value of 1. Alternatively, in response to the data signal A having a logic value 0, the switch T4 is turned off, and the switch T1 is turned on to pull up the potential of the output node O1 to the voltage VDD. In this way, the selection circuit 120 outputs a signal SA having a logic value 1 to the output circuit 140. The output circuit 140 may output an output signal SO having a logic value of 0.

In addition, in response to the aforementioned first condition, the switch M3 and the switch M4 are turned on. Accordingly, the potential of the node NB1 is pulled up to the voltage VDD through the switch M3, and the potential of the node NB2 is pulled down to the voltage GND through the switch M4. Since the internal node of the selection circuit 130 has been set to a fixed potential, regardless of whether the data signal B changes or not, the potential of the output node O2 is not affected by the data signal B and/or parasitic capacitances (for example, the parasitic capacitances CP1 and CP2 between the node NB1 and the output node O2, or the parasitic capacitances CP3 and CP4 between the node NB2 and the output node O2). In this way, when the data signal A is selected as the output signal SO, it can be ensured that the data signal B does not affect the output signal SO.

Under the second condition, the selection signal SEL is a logic value 1 and the selection signal SELb is a logic value 0. In response to this second condition, the switches T2 and T3 are turned off, and the switches T6 and T7 are turned on. In other words, the selection circuit 130 is turned on (i.e., the data signal B is selected) to operate as an inverter, and the selection circuit 120 is turned off. In response to the data signal B having a logic value 1, the switch T5 is turned off, and the switch T8 is turned on to pull down the potential of the output node O1 to the voltage GND. In this way, the selection circuit 130 outputs a signal SB having a logic value 0 to the output circuit 140. The output circuit 140 may output an output signal SO having a logic value of 1. Alternatively, in response to the data signal B having a logic value 0, the switch T8 is turned off, and the switch T5 is turned on to pull up the potential of the output node O2 to the voltage VDD. In this way, the selection circuit 130 outputs a signal SB having a logic value of 1 to the output circuit 140. The output circuit 140 may output an output signal SO having a logic value of 0.

In addition, in response to the aforementioned second condition, the switch M1 and the switch M2 are turned on. Accordingly, the potential of the node NA1 is pulled up to the voltage VDD through the switch M1, and the potential of the node NA2 is pulled down to the voltage GND through the switch M2. Since the internal node of the selection circuit 120 has been set to a fixed potential, regardless of whether the data signal A changes or not, the potential of the output node O1 is not affected by the data signal A and/or parasitic capacitances (for example, the parasitic capacitances C1 and C2 between the node NA1 and the output node O1, or the parasitic capacitance C3 between the node NA2 and the output node O1). In this way, when the data signal B is selected as the output signal SO, it can be ensured that the data signal A does not affect the output signal SO.

Figure 3:
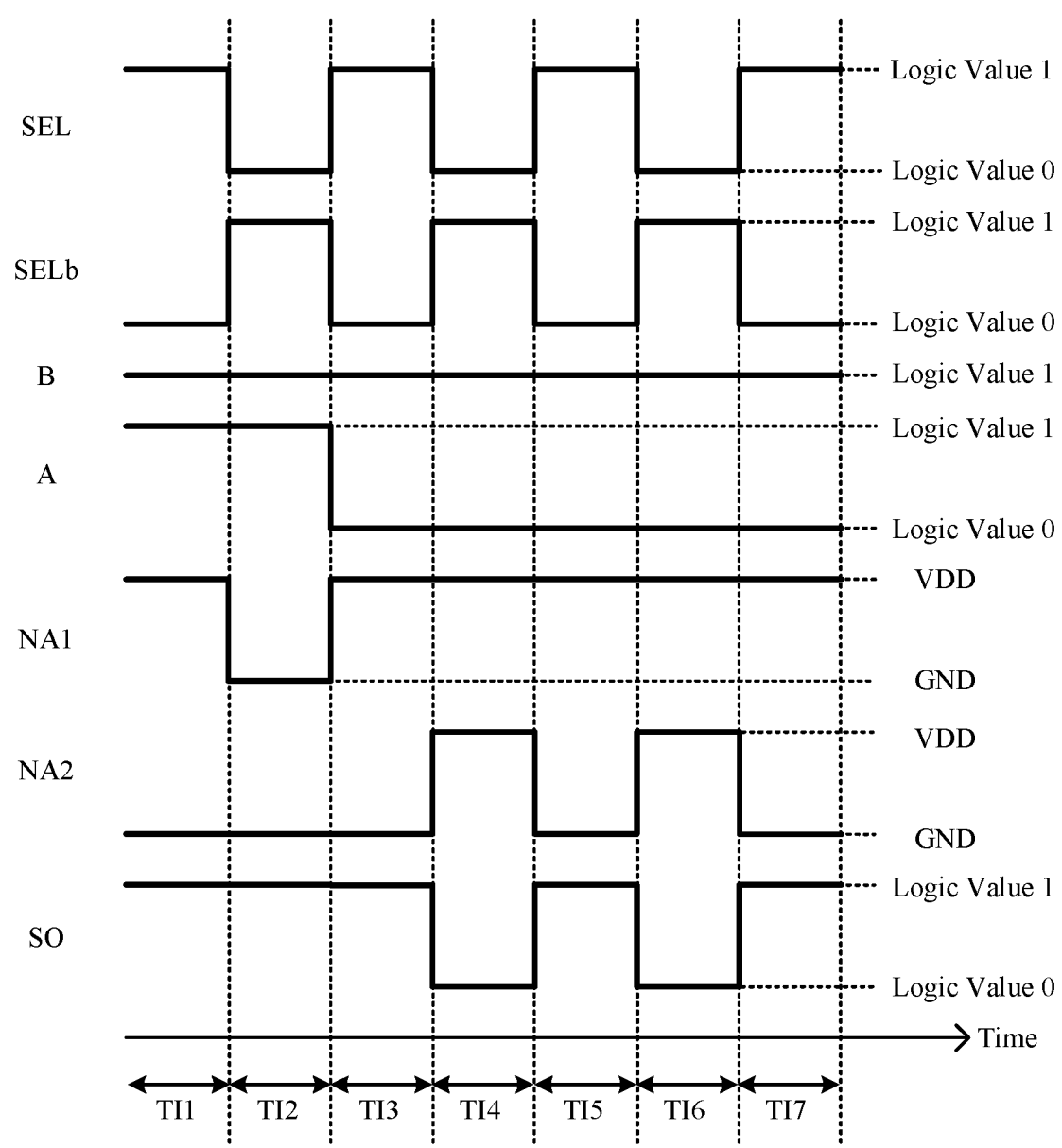
FIG. 3 is a waveform diagram of the nodes and/or signals in FIG. 2 according to embodiments of the present application.

FIG. 3 is a waveform diagram of the nodes and/or signals in FIG. 2 according to embodiments of the present application.

In some embodiments, before the data signal A is selected as the output signal SO, that is, before the first condition (such as the selection signals SEL and SELb corresponding to the periods TI2, TI4 and TI6) occurs, the nodes NA1 and NA2 of the selection circuit 120 are reset to a fixed potential. Therefore, no matter how the data signal A changes, before the data signal A is selected, the charge stored in the parasitic capacitance in the selection circuit 120 can be cleared by the reset operation. In this way, the influence of the aforementioned storage effect can be improved to increase the performance of the multiplexer device 100.

For example, during the periods TI1, TI3, TI5 and TI7 (that is, before the data signal A is selected as the output signal SO), the selection signal SEL is a logic value 1 and the selection signal SELb is a logic value 0. As mentioned above, under this condition, the potential of the node NA1 is pulled up to the voltage VDD through the switch M1, and the potential of the node NA2 is pulled down to the voltage GND through the switch M2. Therefore, regardless of whether the data signal A has a logic value 1 or a logic value 0 previously, the current output signal SO will not be affected by the storage effect of the parasitic capacitance. For example, during periods TI2, TI4 and TI6 (that is, data signal A is selected as the output signal SO), the output signal SO can be correctly the same as the data signal A.

Figure 4:
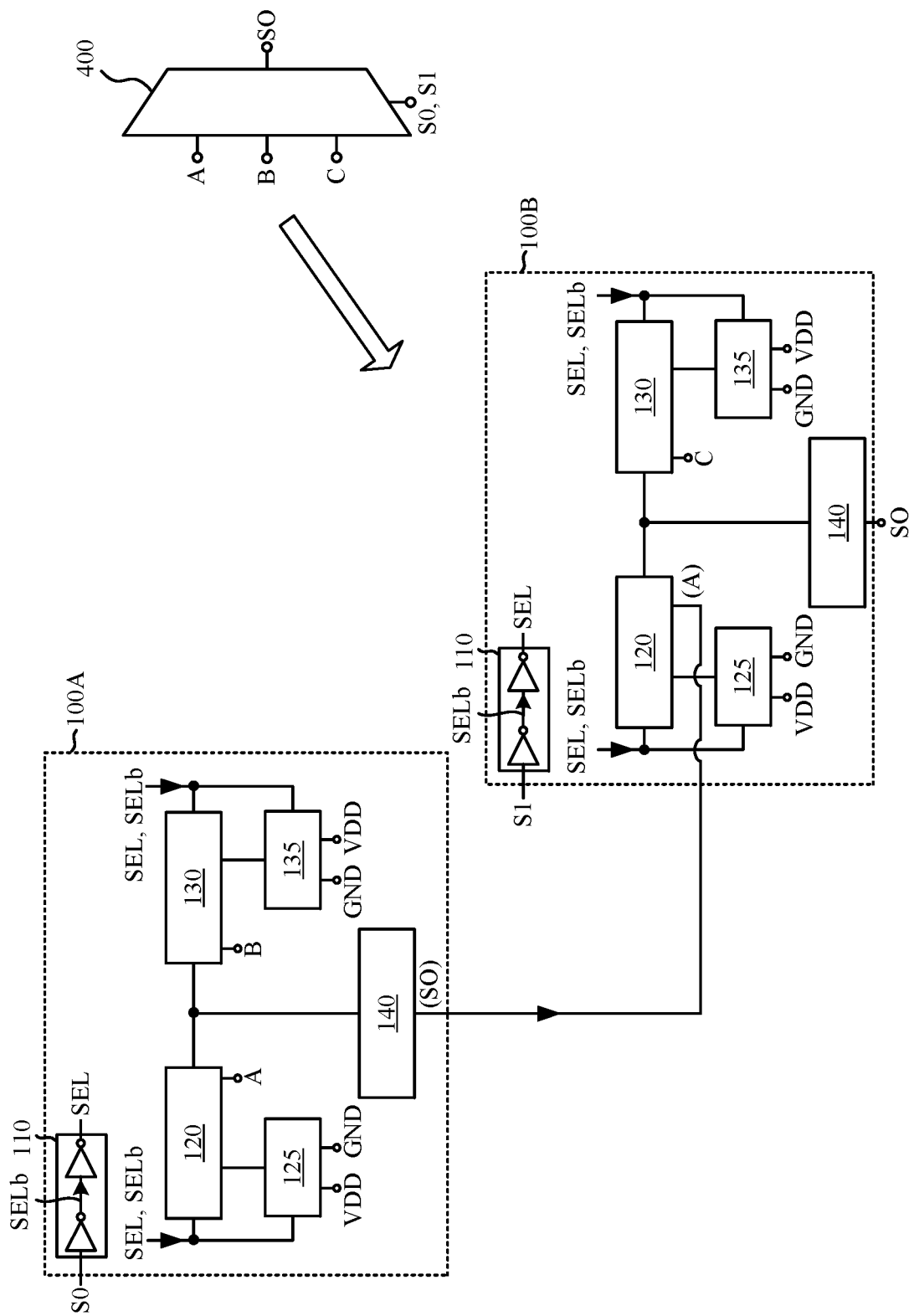
FIG. 4 is a schematic diagram of a multiplexer device of FIG. 1B according to embodiments of the present application.

FIG. 4 is a schematic diagram of a multiplexer device 400 of FIG. 1B according to embodiments of the present application.

In some embodiments, the multiplexer device 100 can be extended to applications with more inputs. For example, as shown in FIG. 4, the multiplexer device 400 is applicable to three inputs, which are data signals A, B and C. In this example, the multiplexer device 400 selects a corresponding one of the data signals A, B and C according to the selection signals S0 and S1 as the output signal SO.

As shown in FIG. 4, the multiplexer device 400 includes two multiplexer devices 100A and 100B. The circuits of the multiplexer devices 100A and 100B and the circuits of FIG. 1B and FIG. 2 have similar circuit structures, so detailed operations and circuit setting methods can refer to the foregoing embodiments, and are not repeated here.

In the multiplexer device 100A, the control signal generating circuit 110 includes two-stage inverters connected in series, which generate selection signals SEL and SELb for the multiplexer device 100A according to a selection signal S0. The multiplexer device 100A receives the data signal A and the data signal B, and the output of the multiplexer device 100A (for example, its output signal SO) is provided to an input of a selection circuit (for example, 120) in the multiplexer device 100B. In the multiplexer device 100B, the control signal generating circuit 110 includes two-stage inverters connected in series, which generate the selection signals SEL and SELb for the multiplexer device 100B according to a selection signal S1. An input of another selection circuit (for example, 130) in the multiplexer device 100B receives a data signal C. In some embodiments, the selection signals S0 and S1 can be generated by a decoder circuit (not shown).

In this example, when the selection signal S0 is a logic value 0 and the selection signal S1 is a logic value 1, the multiplexer device 400 selects the data signal A as the output signal SO. When the selection signal S0 is a logic value 1 and the selection signal S1 is a logic value 0, the multiplexer device 400 selects the data signal B as the output signal SO. Regardless of the selection signal S0 (i.e., X in the table below, which represents "don't care"), when the selection signal S1 is a logic value 1, the multiplexer device 400 selects the data signal C as the output signal SO. The above operation can be expressed as the following truth table:

| S0 | S1 | SO |
|----|----|----|
| 0  | 0  | A  |
| 1  | 0  | B  |
| X  | 1  | C  |

Figure 5:
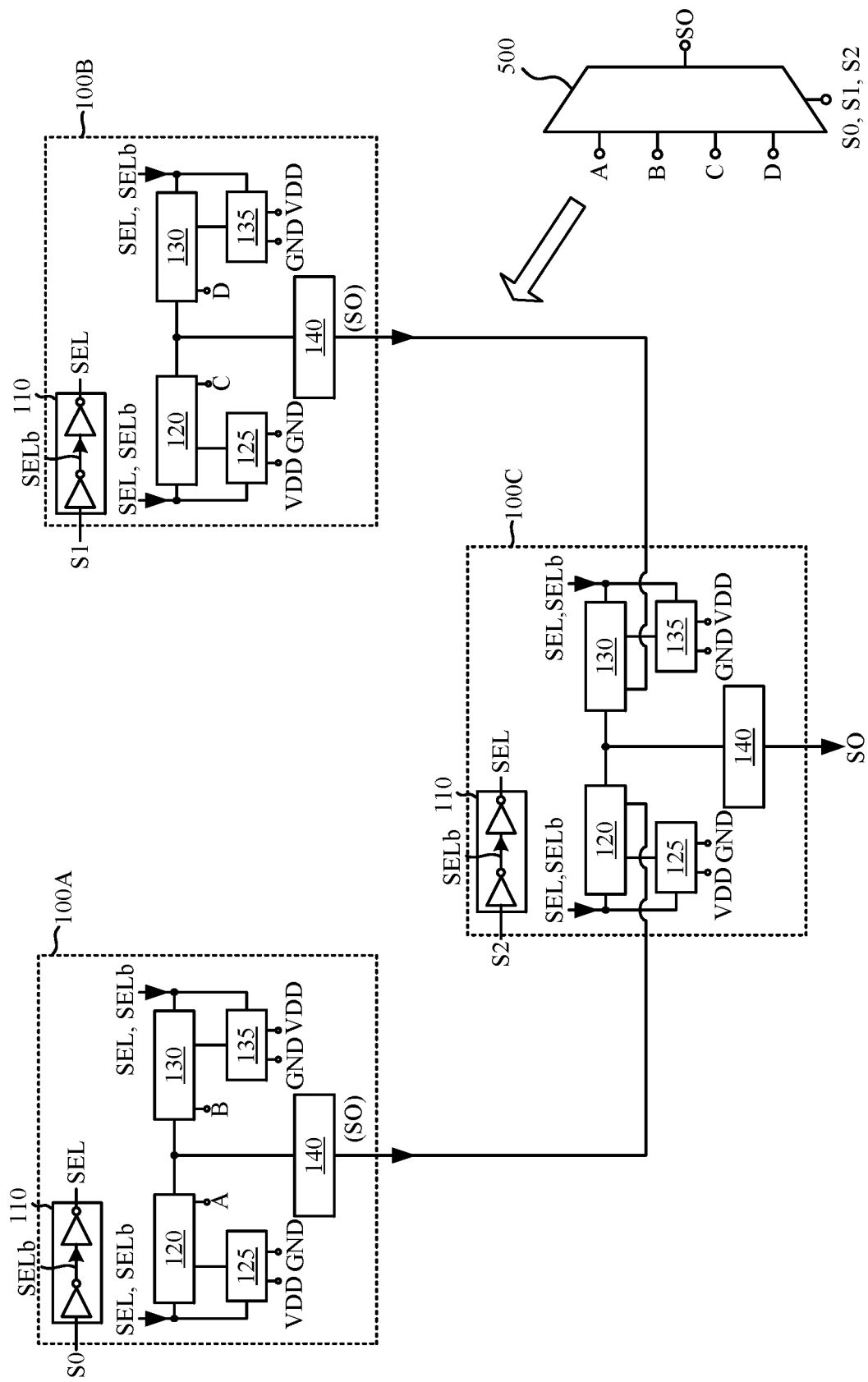
FIG. 5 is a schematic diagram of a multiplexer device of FIG. 1B according to embodiments of the present application.

FIG. 5 is a schematic diagram of a multiplexer device 500 of FIG. 1B according to embodiments of the present application. For ease of understanding, similar elements in FIG. 1B, FIG. 2 and FIG. 5 will be designated by the same reference numerals.

As shown in FIG. 5, the multiplexer device 500 is applicable to four inputs, which are data signals A, B, C and D. In this example, the multiplexer device 400 further receives the selection signals S0 to S2, and selects a corresponding one of the data signals A, B, C and D according to the selection signals S0 to S2 as the output signal SO.

As shown in FIG. 5, the multiplexer device 500 includes three multiplexer devices 100A to 100C. The circuits of the multiplexer devices 100A to 100C and the circuits of FIG. 1B and FIG. 2 have similar circuit structures, so detailed operations and circuit setting methods can refer to the foregoing embodiments, and are not repeated here.

In the multiplexer device 100A, the control signal generating circuit 110 includes two-stage inverters connected in series, which generate selection signals SEL and SELb for the multiplexer device 100A according to the selection signal SO. The multiplexer device 100A receives the data signal A and the data signal B, and the output of the multiplexer device 100A (for example, its output signal SO) is provided to an input of a selection circuit (for example, 120) in the multiplexer device 100C. In the multiplexer device 1008, the control signal generating circuit 110 includes two-stage inverters connected in series, which generate the selection signals SEL and SELb for the multiplexer device 100B according to the selection signal S1. The multiplexer device 100B receives the data signal C and a data signal D, and the output of the multiplexer device 1008 (for example, its output signal SO) is provided to the input of another selection circuit (for example, 130) in the multiplexer device 100C. In the multiplexer device 100C, the control signal generating circuit 110 includes two-stage inverters connected in series, which generate the selection signals SEL and SELb for the multiplexer device 100C according to the selection signal S2. In some embodiments, the selection signals S0 to S2 can be generated by a decoder circuit (not shown).

In this example, regardless of the selection signal S1, when the selection signals S0 and S2 are both logic value 0, the multiplexer device 500 selects the data signal A as the output signal SO. Regardless of the selection signal S1, when the selection signal S0 is a logic value 1 and the selection signal S2 is a logic value 0, the multiplexer device 500 selects the data signal B as the output signal SO. Regardless of the selection signal S0, when the selection signal S1 is a logic value 0 and the selection signal S2 is a logic value 1, the multiplexer device 500 selects the data signal C as the output signal SO. Regardless of the selection signal S0, when the selection signals S1 to S2 are logical value 1, the multiplexer device 500 selects the data signal D as the output signal SO.

| S0 | S1 | S2 | SO |
|---|---|---|---|
| 0 | X | 0 | A |
| 1 | X | 0 | B |
| X | 0 | 1 | C |
| X | 1 | 1 | D |

Each switch of the above embodiments can be implemented by N-type or P-type transistors, for example, switches T1 to T2, T5 to T6, M1 and M3 can be implemented by P-type transistors, and switches T3 to T4, T7 to T8, M2 and M4 can be implemented by N-type transistors, but the present application is not limited thereto. The drawings of the foregoing embodiments are described by using a metal oxide semiconductor field effect transistor (MOSFET) as an example, but the present application is not limited thereto. According to the teachings of the one or more embodiments described above, other embodiments of this case may also implement corresponding circuits by other types of transistors. Therefore, the implementation of various types of transistors is within the scope of the present application.

FIG. 6 is a flowchart of a signal switching method 600 according to some embodiments of the present application.

In operation S610, the corresponding one of the data signal A and the data signal B is selected as the output signal SO according to the selection signal SEL.

In operation S620, when the data signal B is selected as the output signal SI, the potential of the node NA1 (or the node NA2) of the selection circuit 120 is set to the voltage VDD (or the voltage GND), and the selection circuit 120 receives the data signal A.

For the descriptions of the operations S610 and S620, reference may be made to the foregoing embodiments in FIGS. 1 to 3, and therefore their descriptions are not repeated. The multiple operations of the signal switching method 600 described above are merely examples, and are not limited to the sequential execution of the above examples. Various operations under the signal switching method 600 may be appropriately added, replaced, omitted, or performed in a different order without departing from the operation mode and scope of the embodiments of the present application.

In sum, the multiplexer device and the signal switching method provided by embodiments of the present application can retain the potential of the internal node of the circuit during the signal switching process to prevent the output of the multiplexer from being disturbed by jitter and/or parasitic capacitance.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present application cover modifications and variations of this application provided they fall within the scope of the following claims. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A multiplexer device including:
    a plurality of selection circuits configured to receive a first data signal and a second data signal respectively, wherein the plurality of selection circuits are configured to select a corresponding one of the first data signal and the second data signal as an output signal according to a first selection signal;
    a first potential setting circuit configured to set a potential of a first node of a first selection circuit of the plurality of selection circuits to a first voltage when the second data signal is selected as the output signal, wherein the first selection circuit is configured to receive the first data signal; and
    a second potential setting circuit configured to set a second node of a second selection circuit of the plurality of selection circuits to the first voltage when the first data signal is selected as the output signal, wherein the second selection circuit is configured to receive the second data signal.

2. The multiplexer device of claim 1, wherein when the second data signal is selected as the output signal, the first selection circuit is further configured to be turned off according to the first selection signal.

3. The multiplexer device of claim 1, wherein the first selection circuit includes:
   a first switch, wherein a first terminal of the first switch is configured to receive the first voltage, a second terminal of the first switch is coupled to the first node, and a control terminal of the first switch is configured to receive the first data signal;
   a second switch, wherein a first terminal of the second switch is coupled to the first node, a second terminal of the second switch is coupled to a first output node, and a control terminal of the second switch is configured to receive the first selection signal;
   a third switch, wherein a first terminal of the third switch is coupled to the first output node, a second terminal of the third switch is coupled to the second node, and a control terminal of the third switch is configured to receive a second selection signal; and
   a fourth switch, wherein a first terminal of the fourth switch is coupled to the second node, a second terminal of the fourth switch is configured to receive a second voltage, and a control terminal of the fourth switch is configured to receive the first data signal.

4. The multiplexer device of claim 3, wherein the first potential setting circuit includes:
   a fifth switch configured to pull up the potential of the first node to the first voltage according to the second selection signal; and
   a sixth switch configured to pull down a potential of the second node to the second voltage according to the first selection signal.

5. The multiplexer device of claim 3, further comprising:
   a control signal generating circuit configured to generate the second selection signal according to the first selection signal, wherein the first selection signal is inverted to the second selection signal.

6. The multiplexer device of claim 3, wherein the first output node is coupled to the first node or the second node via a parasitic capacitance.

7. The multiplexer device of claim 3, further comprising:
   an output circuit coupled to the first output node, wherein the output circuit is configured to output the output signal.

8. The multiplexer device of claim 1, wherein before the first data signal is selected as the output signal, the first potential setting circuit is further configured to set the potential of the first node to the first voltage according to the first selection signal.

9. The multiplexer device of claim 1, wherein before the second data signal is selected as the output signal, the second potential setting circuit is further configured to set the potential of the second node to the first voltage according to the first selection signal.

10. The multiplexer device of claim 1, wherein the second selection circuit comprises:
    a first switch, wherein a first terminal of the first switch is configured to receive the first voltage, a second terminal of the first switch is coupled to the second node, and a control terminal of the first switch is configured to receive the second data signal;
    a second switch, wherein a first terminal of the second switch is coupled to the second node, a second terminal of the second switch is coupled to a second output node, and a control terminal of the second switch is configured to receive a second selection signal;
    a third switch, wherein a first terminal of the third switch is coupled to the second output node, a second terminal of the third switch is coupled to a third node, and a control terminal of the third switch is configured to receive the first selection signal; and
    a fourth switch, wherein a first terminal of the fourth switch is coupled to the third node, a second terminal of the fourth switch is configured to receive a second voltage, and a control terminal of the fourth switch is configured to receive the second data signal.

11. The multiplexer device of claim 10, wherein the second potential setting circuit comprises:
    a fifth switch configured to pull up the potential of the second node to the first voltage according to the first selection signal; and
    a sixth switch configured to pull down a potential of the third node to the second voltage according to the second selection signal.

12. The multiplexer device of claim 10, wherein the second output node is coupled to the second node or the third node via a parasitic capacitance.

13. The multiplexer device of claim 1, wherein when the first data signal is selected as the output signal, the second selection circuit is further configured to be turned off according to the first selection signal.

* * * * *